(12) United States Patent
Kim

(10) Patent No.: US 11,437,979 B2
(45) Date of Patent: Sep. 6, 2022

(54) SAW FILTER AND DUPLEXER

(71) Applicant: WISOL CO., LTD., Osan-si (KR)

(72) Inventor: Young Hun Kim, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 227 days.

(21) Appl. No.: 16/914,889

(22) Filed: Jun. 29, 2020

(65) Prior Publication Data
US 2021/0044279 A1 Feb. 11, 2021

(30) Foreign Application Priority Data

Aug. 9, 2019 (KR) .......................... 10-2019-0097319

(51) Int. Cl.
| | | |
|---|---|---|
| *H03H 9/145* | (2006.01) | |
| *H03H 9/72* | (2006.01) | |
| *H01Q 1/50* | (2006.01) | |
| *H03H 9/64* | (2006.01) | |

(52) U.S. Cl.
CPC .............. *H03H 9/725* (2013.01); *H01Q 1/50* (2013.01); *H03H 9/145* (2013.01); *H03H 9/6483* (2013.01)

(58) Field of Classification Search
None
See application file for complete search history.

(56) References Cited

U.S. PATENT DOCUMENTS

| | | | | |
|---|---|---|---|---|
| 2007/0222540 | A1* | 9/2007 | Nishigaki | H03H 9/0571 333/133 |
| 2018/0375495 | A1* | 12/2018 | Taguchi | H03H 9/72 |
| 2020/0295734 | A1* | 9/2020 | Urata | H03H 9/059 |
| 2020/0304101 | A1* | 9/2020 | Choi | H03H 9/6483 |

FOREIGN PATENT DOCUMENTS

| | | |
|---|---|---|
| KR | 10-2019-0037295 A | 4/2019 |
| WO | 2018/047862 A1 | 3/2018 |

* cited by examiner

*Primary Examiner* — Kodzovi Acolatse
(74) *Attorney, Agent, or Firm* — LRK Patent Law Firm

(57) ABSTRACT

A SAW filter is a high-frequency filter including a common terminal, a transmission terminal and a reception terminal through which high-frequency signals are inputted and outputted. The SAW filter includes: a first filter circuit having a first frequency band as a pass band, and connected to the common terminal and the transmission terminal; a second filter circuit having a second frequency band different from the first frequency band as a pass band, and connected to the common terminal and the reception terminal; an antenna connected to the common terminal; and at least one inductor connected in series between the common terminal and the first filter circuit or the second filter circuit.

12 Claims, 17 Drawing Sheets

SAW FILTER AND DUPLEXER

CROSS REFERENCE TO RELATED APPLICATION

This application claims priority to Korean Patent Application No. 10-2019-0097319, filed on Aug. 9, 2019, which is hereby incorporated by reference for all purposes as if fully set forth therein.

BACKGROUND OF THE INVENTION

1. Field of the Invention

The present invention relates to a SAW filter and a duplexer. More specifically, the present invention relates to a SAW filter and a duplexer, which can obtain attenuation characteristics in a wide frequency range by separating antenna pads connected to filters that pass frequencies of different bands and inserting an additional inductor in each of the antenna pads.

2. Description of Related Art

A filter is an element for passing or removing frequencies of a specific band, and it is an essential element in communication, signal generation, signal processing, and signal output. The filter like this is typically used in the field of mobile communication, and a SAW filter and a duplexer are used as elements that pass or remove frequencies of a specific band in a mobile communication device.

As conventional SAW filters and duplexers are mainly used in the band of 850 MHz to 2.6 GHz, attenuation performance is required importantly only for some frequency bands. However, owing to GPS band, harmonic attenuation, appearance of various multi-frequency communication systems, and commercialization of 5G systems using ultra-high frequency bands of 3.5 GHz or higher, frequencies much more diverse than before and attenuation characteristics in high frequency and ultra-high frequency bands are required.

Furthermore, high performance and miniaturization of SAW filters and duplexers are also required so that they may be applied to communication devices with gradually increased performance and miniaturization. Miniaturization of SAW filters and duplexers like this has a problem in that it is difficult to secure sufficient attenuation characteristics due to limitation in design space and increase of coupling.

To overcome the problem, a technique of configuring a matching stage of a low pass filter (LPF) type by connecting additional inductors and capacitors on the outside of the SAW filter and the duplexer or configuring a DMS-type SAW filter is disclosed to secure attenuation characteristics in a high frequency band.

However, this technique reduces the external space for matching the filter and other components, increases material cost, and reduces degree of freedom in designing the filter.

Therefore, a SAW filter and a duplexer of a new structure capable of maintaining existing miniaturization characteristics while securing attenuation characteristics in high frequency and ultra-high frequency regions are required.

SUMMARY OF THE INVENTION

Therefore, the present invention has been made in view of the above problems, and it is an object of the present invention to provide a SAW filter and a duplexer capable of obtaining excellent attenuation characteristics in a wide high-frequency band by separating antenna pads connected to filters that pass frequencies of different bands and selectively inserting an inductor in the separated antenna pads.

The technical problems of the present invention are not limited to the technical problems mentioned above, and other technical problems not mentioned will be clearly understood by those skilled in the art from the following description.

A SAW filter according to an embodiment of the present invention is a high-frequency filter including a common terminal, a transmission terminal and a reception terminal through which high-frequency signals are inputted and outputted, and the filter comprises: a first filter circuit having a first frequency band as a pass band, and connected to the common terminal and the transmission terminal; a second filter circuit having a second frequency band different from the first frequency band as a pass band, and connected to the common terminal and the reception terminal; an antenna connected to the common terminal; and at least one inductor connected in series between the common terminal and the first filter circuit or the second filter circuit.

According to an embodiment, the inductor may include a first inductor inserted in the first antenna pad and a second inductor inserted in the second antenna pad.

According to an embodiment, the antenna may include a first antenna pad branched from the common terminal and connected to the first filter circuit and a second antenna pad branched from the common terminal and connected to the second filter circuit, and the first and second antenna pads may be provided on the same plane.

According to an embodiment, an attenuation region of the first filter circuit or the second filter circuit may be adjusted according to an inductance value of the inductor.

According to an embodiment, the SAW filter may further comprise at one shunt capacitor inserted between the first filter circuit or the second filter circuit and the inductor.

According to an embodiment, the SAW filter may further comprise a bump electrically connecting the inductor and the first antenna pad or the second antenna pad.

A duplexer according to another embodiment of the present invention is a duplexer including a common terminal, a transmission terminal and a reception terminal through which high-frequency signals are inputted and outputted, and the duplexer comprises: a transmission filter connected to the common terminal and the transmission terminal; a reception filter connected to the common terminal and the reception terminal; an antenna connected to the common terminal; and at least one inductor connected in series between the common terminal and the transmission filter or the reception filter.

According to an embodiment, the antenna may include a first antenna pad branched from the common terminal and connected to the transmission filter and a second antenna pad branched from the common terminal and connected to the reception filter, and the first and second antenna pads may be provided on the same plane.

According to an embodiment, the inductor may include a first inductor inserted in the first antenna pad and a second inductor inserted in the second antenna pad.

According to an embodiment, an attenuation region of the transmission filter or the reception filter may be adjusted according to an inductance value of the inductor.

According to an embodiment, the duplexer may further comprise at one shunt capacitor inserted between the transmission filter or the reception filter and the inductor.

According to an embodiment, the duplexer may further comprise a bump electrically connecting the inductor and the first antenna pad or the second antenna pad.

According to an embodiment, the reception filter may be configured of a ladder-type circuit including a SAW resonator.

According to an embodiment, the reception filter may include a SAW resonator connected on the second antenna pad side in series and a plurality of IDT electrodes connected to the SAW resonator in series.

DETAILED DESCRIPTION OF THE PREFERRED EMBODIMENT

Figure 1:
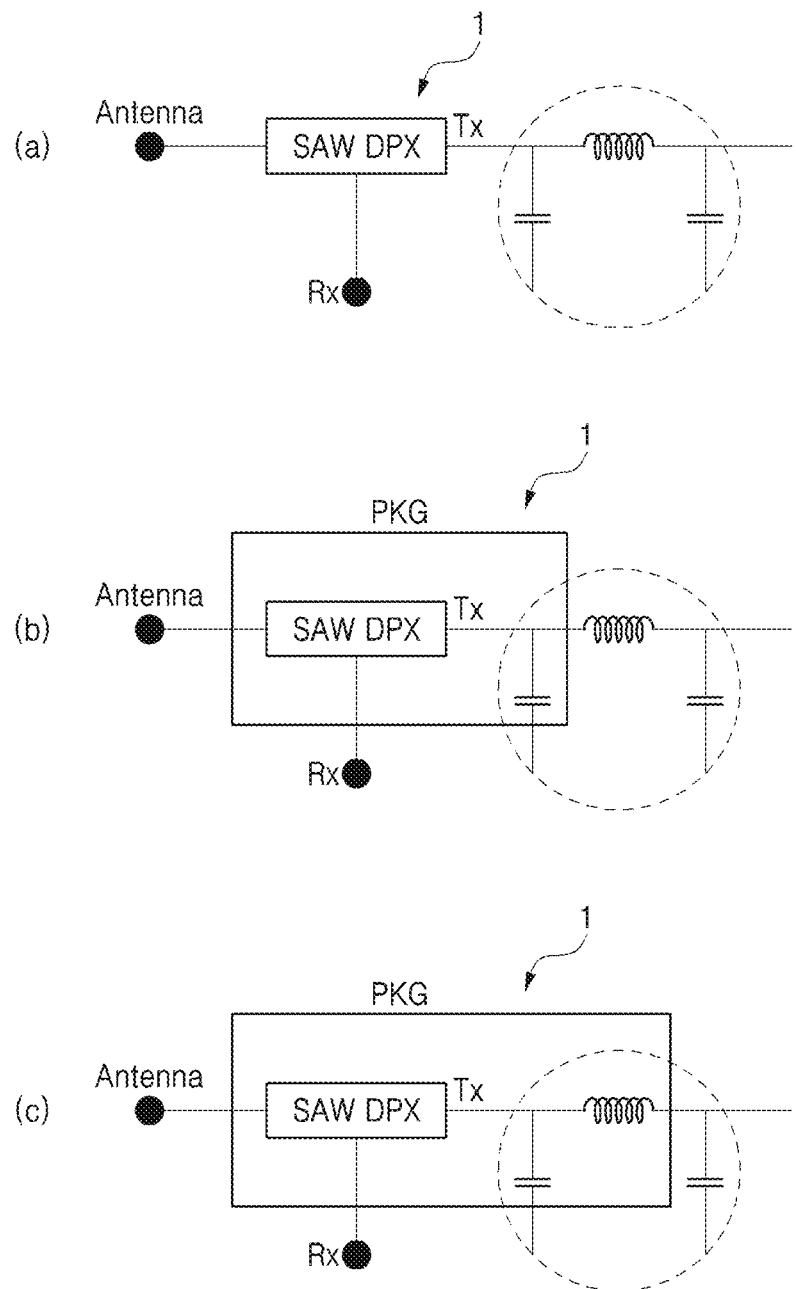
FIG. 1 is a view schematically showing the circuit of a SAW duplexer according to the prior art.

Hereafter, the preferred embodiments of the invention will be described in detail with reference to the accompanying drawings. The advantages and features of the present invention and the methods for achieving them will become apparent with reference to the embodiments described below in detail together with the accompanying drawings. Throughout the specification, like reference numerals refer to like components.

Unless otherwise defined, all terms (including technical and scientific terms) used in the present invention may be used in a sense that can be commonly understood by those skilled in the art to which this specification belongs. In addition, the terms defined in a generally used dictionary are not excessively interpreted unless explicitly and specially defined. The terms used in the present specification are for describing the embodiments and not intended to limit the present specification. In the present specification, a singular form also includes a plural form unless otherwise specified in the phrase.

"Comprises" and "comprising" used in this specification do not exclude presence or addition of one or more other components, steps, operations or elements for the mentioned components, steps, operations or elements.

FIG. 1 is a view schematically showing the circuit of a conventional SAW duplexer 1.

The conventional SAW duplexer 1 is to improve the attenuation characteristics in a high frequency band by matching the low frequency low pass filter (LPF) shown in a dotted line to the transmission terminal TX as shown in (a) of FIG. 1. However, a method of embedding some of the capacitors and inductors of the LPF in the SAW duplexer 1 as shown in (b) and (c) of FIG. 1 has been disclosed.

However, when it is desired to improve the attenuation characteristics in the high frequency band by matching the LPF as described above, there is a problem in that the degree of design freedom of the SAW duplexer 1 is lowered, and manufacturing cost increases.

Accordingly, the present invention proposes a structure capable of improving the attenuation characteristics in a high frequency band while maintaining the existing structures of the SAW filter and the duplexer as much as possible.

Figure 2:
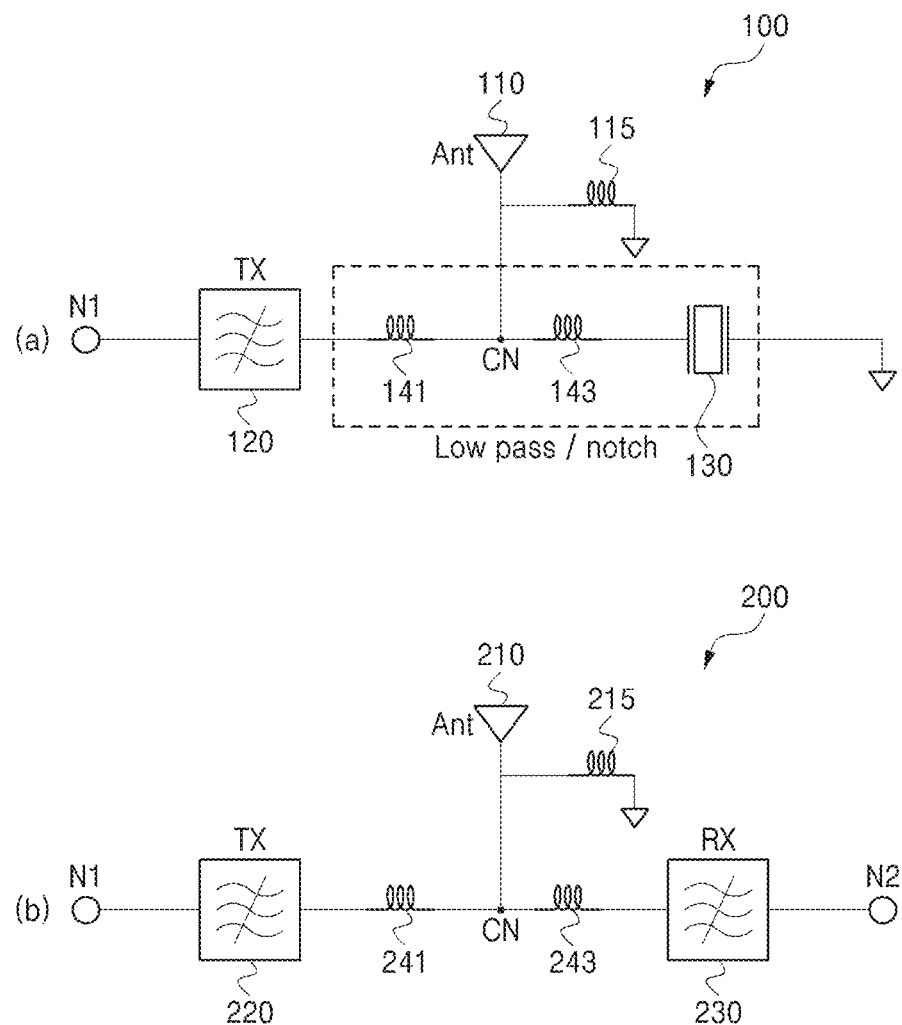
FIG. 2 is a view schematically showing the circuits of a SAW filter and a duplexer according to a first embodiment of the present invention.
Figure 3:
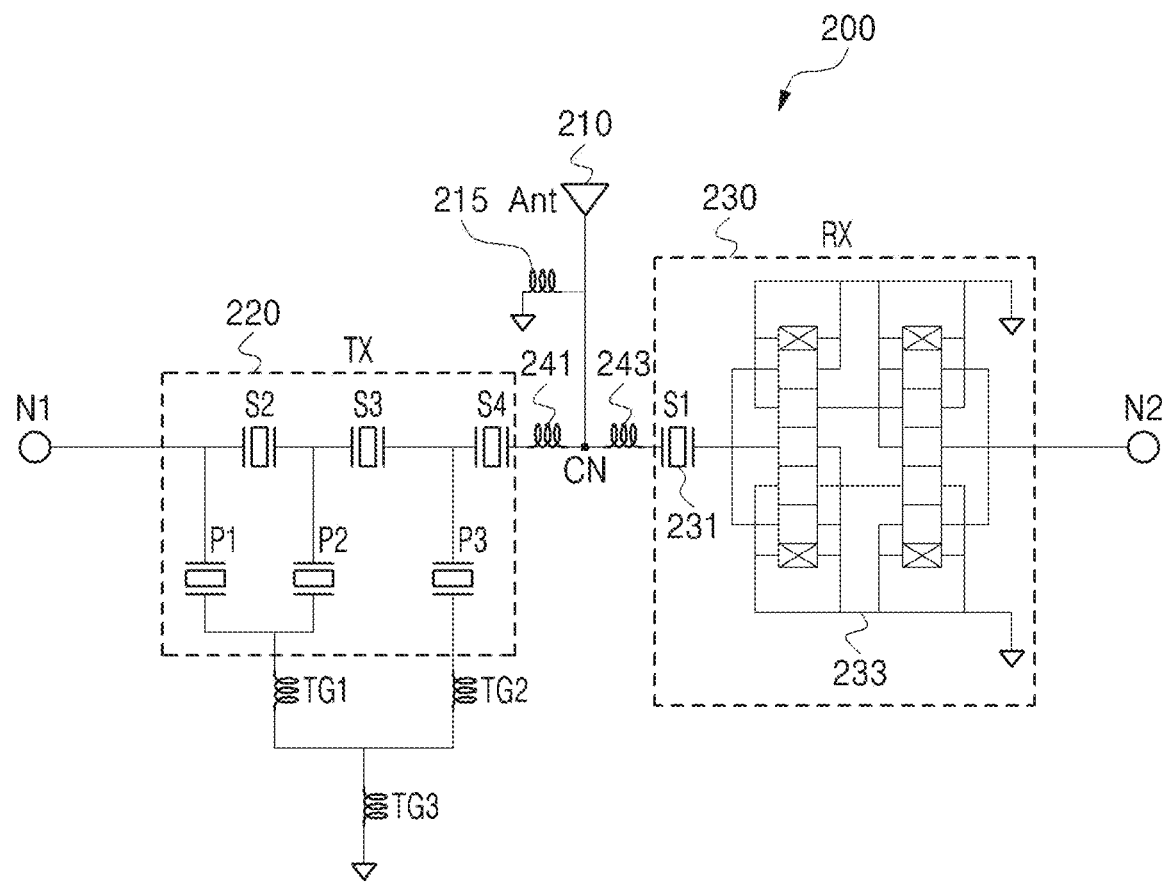
FIG. 3 is a detailed view showing the circuit of a duplexer according to a first embodiment of the present invention.

FIG. 2 is a view schematically showing the circuits of a SAW filter 100 and a duplexer 200 according to a first embodiment of the present invention, and FIG. 3 is a detailed view showing the circuit of a duplexer 200 according to a first embodiment of the present invention.

The SAW filter 100 shown in (a) of FIG. 2 may include an antenna 110, a first filter circuit 120, a second filter circuit 130, a first inductor 141, and a second inductor 143.

A matching inductor 115 is connected to the antenna 110, and the SAW filter 100 may include the first inductor 141 connected to the first filter circuit 120 and the second inductor 143 connected to the second filter circuit 130 through a common terminal CN.

Meanwhile, although not shown in the circuit diagram of FIG. 2, the antenna 110 may include a first antenna pad branched from the common terminal CN and connected to the first filter circuit 120 and a second antenna pad branched from the common terminal CN and connected to the second filter circuit 130, and the first and second antenna pads may be provided on the same plane.

That is, conventionally, when two or more filters are configured in one chip and at least one terminal is connected, the antenna is connected to the first filter circuit 120 and the second filter circuit 130 through one pad. However, in an embodiment of the present invention, the antenna 110 may be connected to the first filter circuit 120 and the second filter circuit 130 by using two antenna pads branched from the antenna 110.

Figure 4:
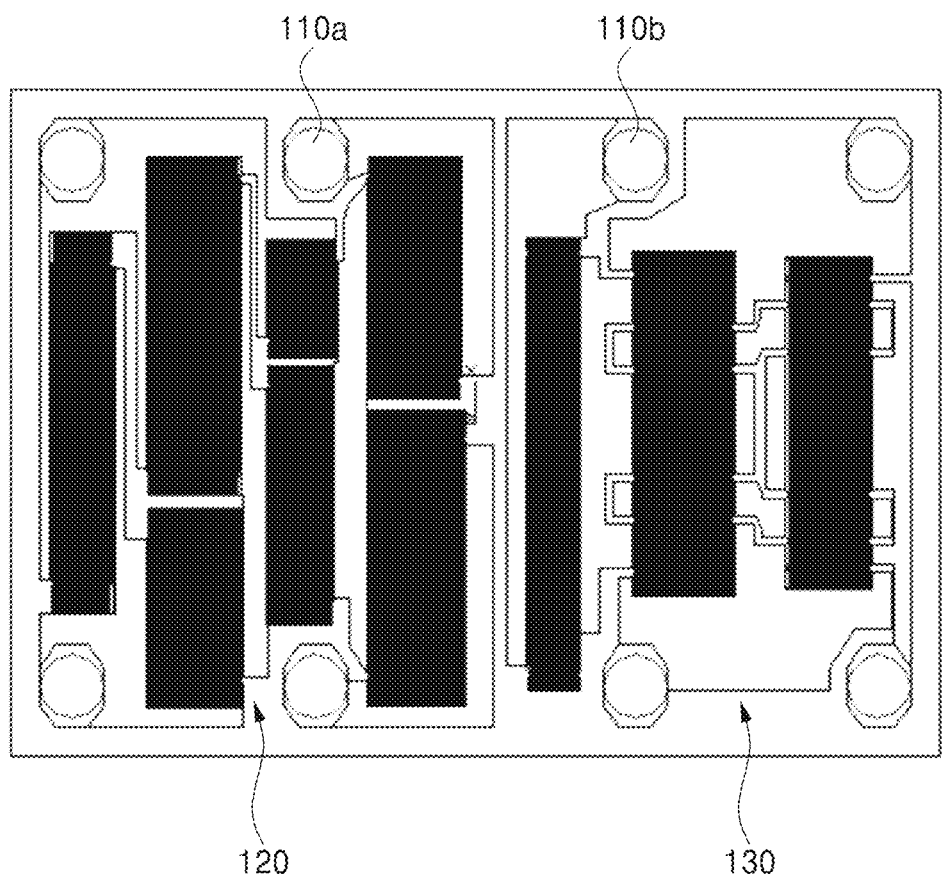
FIG. 4 a view exemplarily showing a layer in which antenna pads are disposed in a SAW filter according to a first embodiment of the present invention.

In relation to this, FIG. 4 is a view exemplarily showing a layer in which antenna pads are disposed in a SAW filter 100 according to a first embodiment of the present invention. In the SAW filter 100 of FIG. 4, unlike the prior art having one antenna pad, separate antenna pads 110a and 110b are provided for the first and second filter circuits 120 and 130 which pass frequencies of different bands.

As described above, when the filters connected through one antenna 110 are electrically separated using different antenna pads 110a and 110b, it is easier to obtain attenuation characteristics in a desired frequency band.

In addition, as the first inductor 141 and the second inductor 143 are inserted in the antenna pads 110a and 110b, attenuation characteristics of a wide band can be obtained through the inductors. In addition, a package including the SAW filter 100 may be electrically connected by providing bumps (not shown) at the points where the first and second inductors 141 and 143 are inserted. Here, when the bumps and the SAW filter 100 are connected, an electrical connection line (feed through) is generated, and the electrical connection line may be included as part of the first or second inductor 141 or 143, or the entire electrical connection line may perform the function of the inductors.

Referring to FIG. 2 again, the first filter circuit 120 may have a first frequency band as a pass band, and may be connected between the first inductor 141 and the transmission terminal N1 in series. In addition, the second filter circuit 130 may be at least one SAW resonator having a second frequency band as a pass band, and may be connected between the second inductor 143 and the ground terminal. Here, either the first frequency band or the second frequency band may be a high or low frequency band without a problem.

The first and second inductors 141 and 143 are inserted in the separated antenna pads 110a and 110b to allow the SAW filter 100 to have attenuation characteristics in a specific frequency band. That is, the attenuation regions of the first and second filter circuits 120 and 130 connected to the antenna pads 110a and 110b may be adjusted according to the inductance values of the first and second inductors 141 and 143.

In addition, the first and second inductors 141 and 143 connected to the antenna pads 110a and 110b may have an inductance value of up to 8 nH, and the inductance value may vary according to the size of the SAW filter 100.

On the other hand, (b) of FIG. 2 is a view showing the duplexer 200 of the first embodiment and may include an antenna 210, a transmission filter 220, a reception filter 230, a first inductor 241, and a second inductor 243.

In the duplexer 200, the transmission filter 220 and the reception filter 230 may also be connected to different antenna pads to be electrically separated like the SAW filter 100 described above, and in addition, as the first and second inductors 241 and 243 are respectively inserted in the antenna pads, the attenuation characteristics in a specific frequency band may be improved.

In addition, referring to FIG. 3, the transmission filter 220 of the duplexer 200 may be a ladder-type circuit including a plurality of series SAW resonators S2, S3 and S4 and parallel SAW resonators P1, P2 and P3, and the reception filter 230 may be formed of a series SAW resonator S1 and a plurality of IDT electrodes connected to the SAW resonator S1 in series.

Meanwhile, bumps (not shown) may be provided at the points where the first and second inductors 241 and 243 are inserted to electrically connect the duplexer 200 and an external device (not shown).

Figure 5:
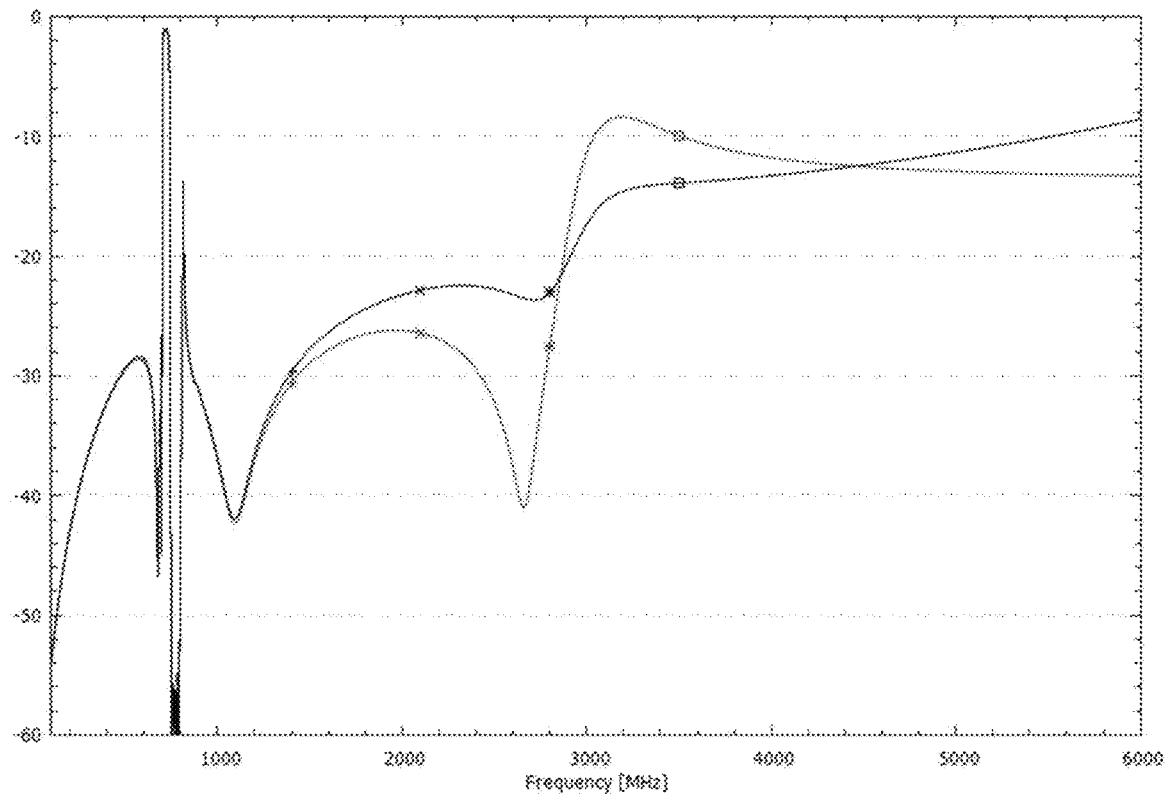
FIGS. 5 to 7 are graphs illustrating attenuation characteristics in a duplexer according to a first embodiment of the present invention.
Figure 6:
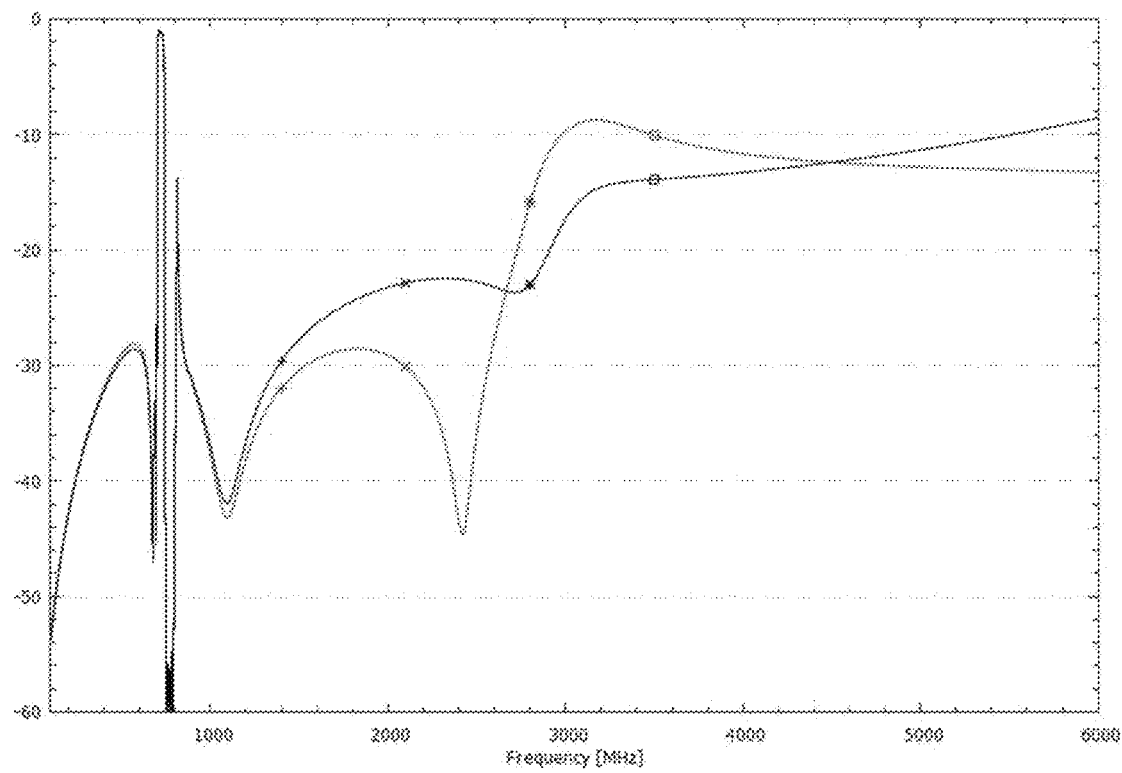
Figure 7:
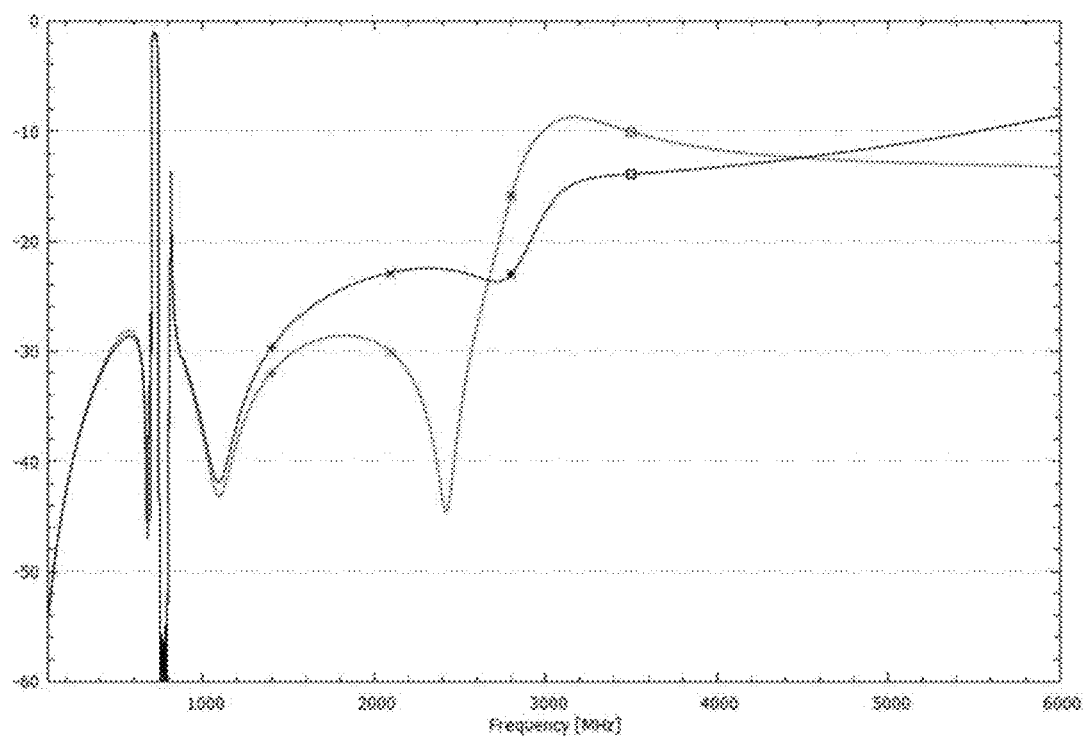

FIGS. 5 to 7 are graphs illustrating attenuation characteristics in a duplexer 200 according to a first embodiment of the present invention.

Referring to FIG. 5, when the first inductor 241 and the second inductor 243 are inserted in the antenna pad connected to the transmission filter 220 and the antenna pad connected to the reception filter 230 in the duplexer 200 and their inductance values are 1 nH respectively, attenuation (dB) with respect to frequency may be confirmed as shown in the figure.

Here, the graph shown in black color is for the conventional duplexer in which separation of antenna pads and insertion of inductors are not accomplished, and the graph shown in red color is for the duplexer 200 of the present invention in which the antenna pads are separated and the first and second inductors 241 and 243 having an inductance value of 1 nH are inserted.

That is, it can be confirmed that as the inductors are inserted in the separated antenna pads as described above, a notch is formed while the SAW filter has a sharp skirt characteristic in the high frequency band of 3000 MHz and that the SAW filter has excellent attenuation characteristics in a wide region of 3000 MHz or more.

FIG. 6 is a view showing insertion loss (dB) with respect to frequency when the first inductor 241 having an inductance value of 0.3 nH is inserted in the antenna pad connected to the transmission filter 220 and the second inductor 243 having an inductance value of 1.5 nH is inserted in the antenna pad connected to the reception filter 230.

Here, the black graph is for the conventional duplexer, and the red graph is for the duplexer 200 including the first and second inductors 241 and 243 having different inductance values, and the antenna pad connected to the transmission filter 220 and the first inductor 241 are provided with a bump to be electrically connected to a package including the duplexer 200.

As described above, as inductors of different values are inserted in the separated antenna pads, attenuation characteristics may be secured in a desired section. That is, it can be confirmed that the SAW filter has a sharp skirt characteristic starting from the high frequency band of 2800 MHz, and has excellent attenuation characteristics in a wide region of 5000 MHz or more.

On the other hand, in addition to inserting inductors having different inductance values in the separated antenna pads of the duplexer 200, a shunt capacitor C may be formed, and when the shunt capacitor is formed, insertion loss (dB) with respect to frequency is as shown in FIG. 7.

Referring to FIG. 7, comparing the conventional duplexer in black color and the duplexer of the present invention in red color, it can be confirmed that notches are formed at a high frequency of 2400 MHz, and the SAW filter has sharp skirt characteristics. In addition, it can be confirmed that the SAW filter has a uniform attenuation characteristic in a wide region of 5000 MHz or more.

Meanwhile, although it is described in FIG. 7 that the shunt capacitor C is formed in a separate antenna pad area of the duplexer 200, the shunt capacitor C may be formed in any one among the duplexer 200 of the present invention and a package including the same.

Until now, the SAW filter 100 and the duplexer 200 according to a first embodiment of the present invention have been described. According to the present invention, attenuation characteristics may be formed in a desired frequency band and excellent attenuation characteristics can be secured in a wide region by separating electrically connected antenna regions and inserting an inductor in each of the antenna regions in the process of implementing two filter circuits having different pass bands in one chip.

Hereinafter, a case of inserting only one inductor in an antenna pad separated from the SAW filter 100 or the duplexer 200 and the characteristic thereof will be described.

Figure 8:
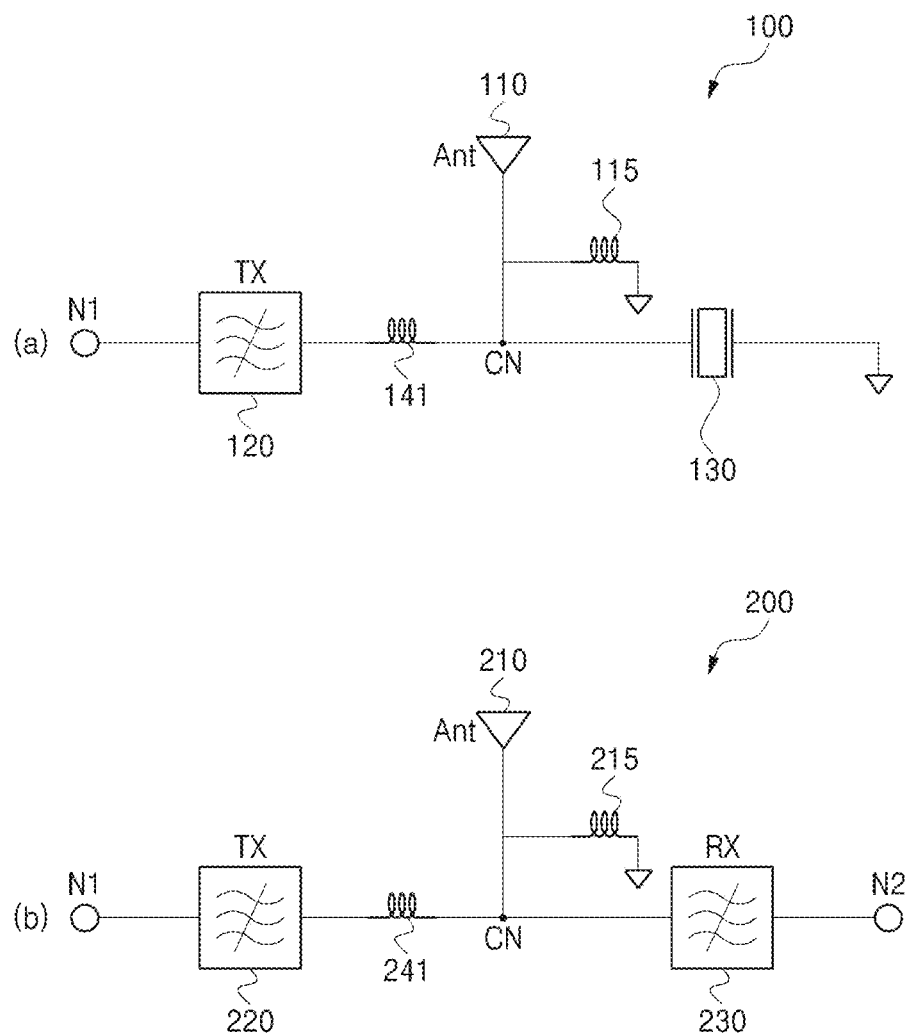
FIG. 8 is a view schematically showing the circuits of a SAW filter and a duplexer according to a second embodiment of the present invention.
Figure 9:
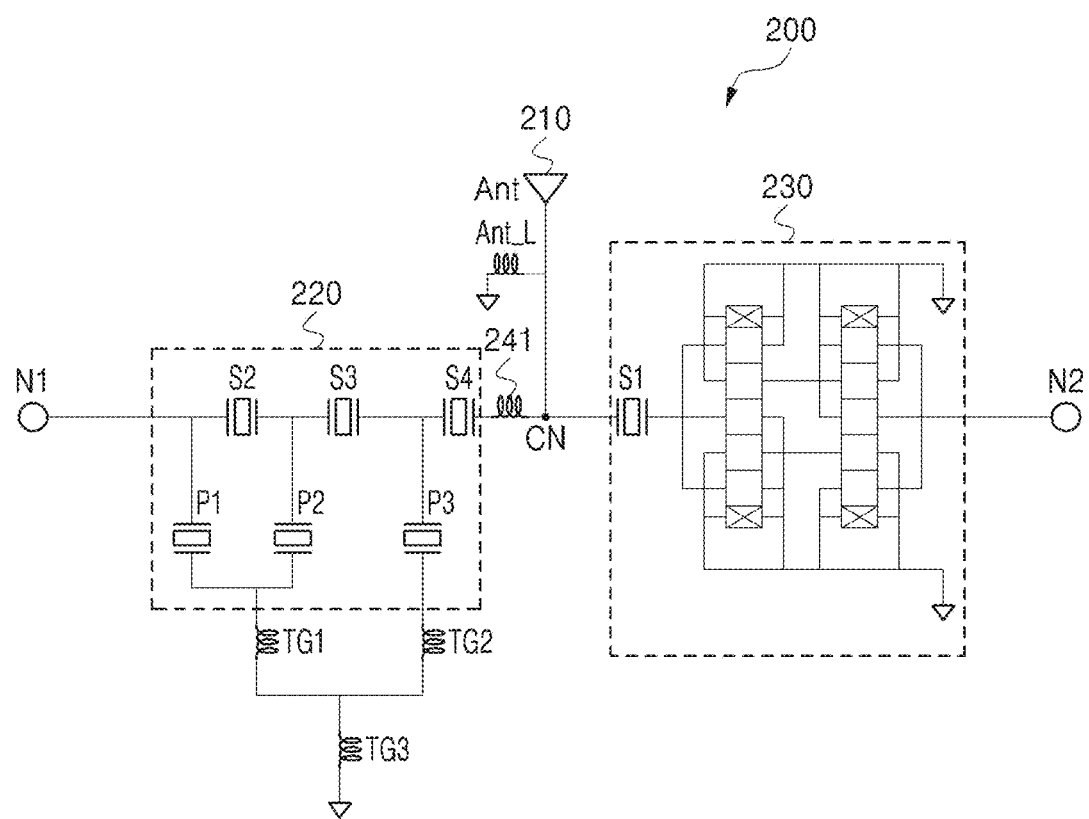
FIG. 9 is a detailed view showing the circuit of a duplex according to a second embodiment of the present invention.

FIG. 8 is a view schematically showing the circuits of a SAW filter 100 and a duplexer 200 according to a second embodiment of the present invention, and FIG. 9 is a detailed view showing the circuit of a duplex 200 according to a second embodiment of the present invention.

In describing the SAW filter 100 and the duplexer 200 according to a second embodiment of FIGS. 8 and 9, description of the components having the same configuration or shape as those of the first embodiment will be omitted. That is, since the components other than the inductor are the same as those of the first embodiment, descriptions thereof are omitted, and only the inductor will be described.

Referring to FIG. 8, the SAW filter 100 shown in (a) of FIG. 8 may include an antenna 110, a first filter circuit 120, a second filter circuit 130, and a first inductor 141, and the duplexer 200 shown in (b) of FIG. 8 may include an antenna 210, a transmission filter 220, a reception filter 230, and a first inductor 241.

In addition, referring to FIG. 9, the transmission filter 220 of the duplexer 200 may be a ladder-type circuit including a plurality of series SAW resonators S2, S3 and S4 and parallel SAW resonators P1, P2 and P3, and the reception filter 230 may be formed of a series SAW resonator S1 and a plurality of IDT electrodes connected to the SAW resonator S1 in series.

The first inductors 141 and 241 inserted in the SAW filter 100 and the duplexer 200 are connected to the antenna pads connected to the first filter circuit 120 and the transmission filter 220 among the two antenna pads branched from the common terminal CN to secure attenuation characteristics in a specific frequency band.

Here, the first inductors 141 and 241 may have an inductance value of up to 8 nH, and the inductance value may vary according to the size of the SAW filter 100 and the duplexer 200.

Figure 10:
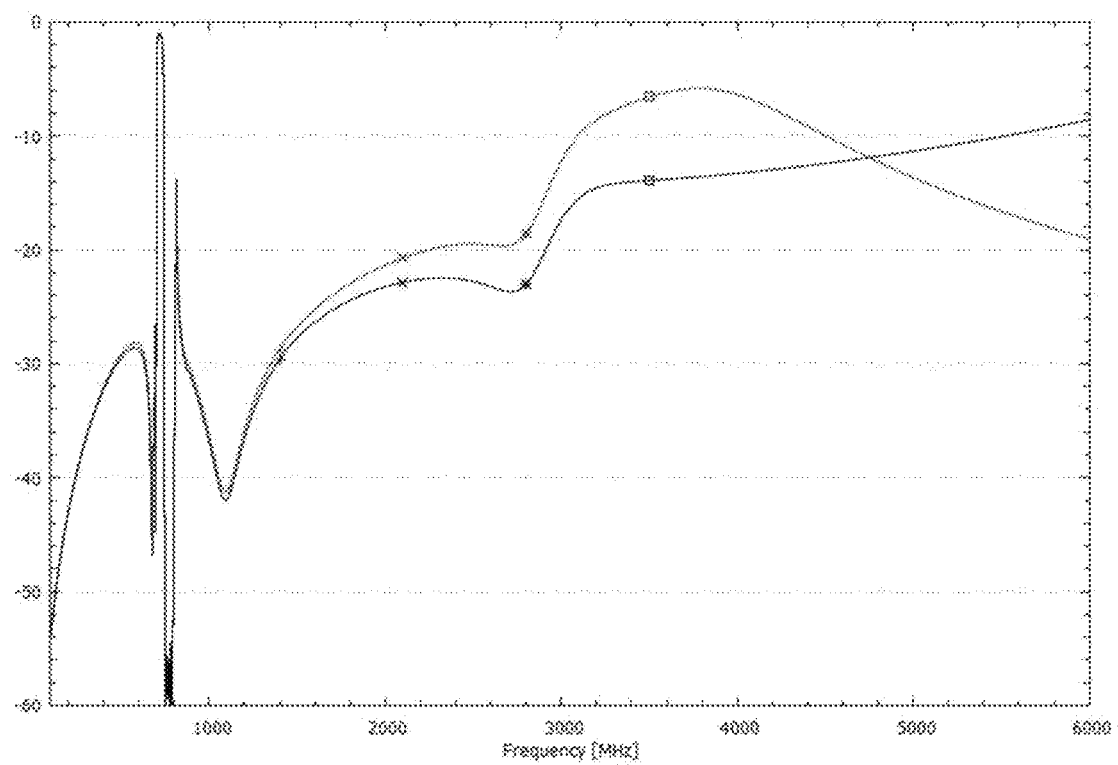
FIG. 10 is a graph illustrating attenuation characteristics in a duplexer according to a second embodiment of the present invention.
Figure 11:
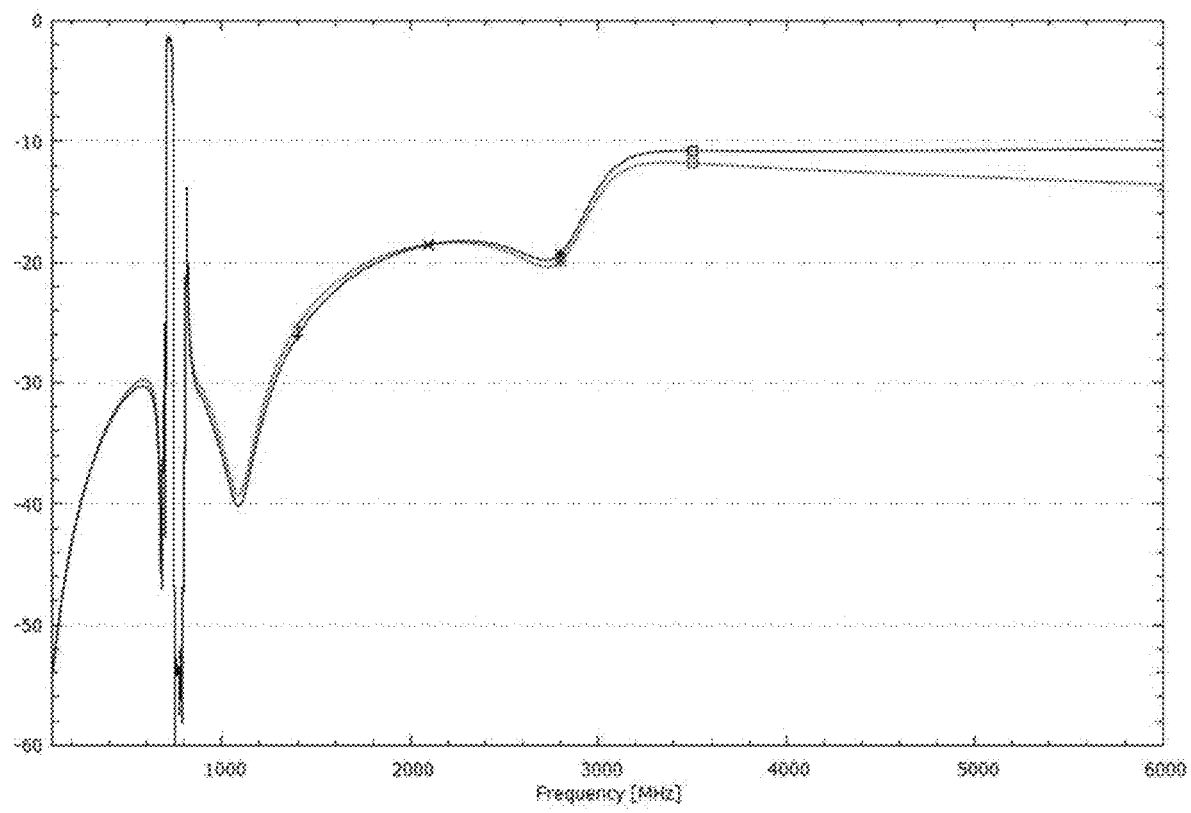
FIG. 11 is a graph illustrating attenuation characteristics in a SAW filter according to a second embodiment of the present invention.

In relation to this, FIG. 10 is a graph illustrating attenuation characteristics in the duplexer 200 according to a second embodiment of the present invention, and FIG. 11 is a graph illustrating attenuation characteristics in the SAW filter 100 according to a second embodiment of the present invention.

Referring to FIG. 10, when the first inductor 241 is inserted in the antenna pad connected to the transmission filter 220 in the duplexer 200 and a corresponding inductance value is 1 nH, attenuation (dB) with respect to frequency may be confirmed as shown in the figure. Here, the black graph is for the conventional duplexer, and the red graph is for the duplexer 200 of the present invention including the first inductor 241 having an inductance value of 1 nH.

As described above, as the first inductor 241 is inserted in the antenna pad connected to the transmission filter 220 among the separated antenna pads, it can be confirmed that the SAW filter has excellent attenuation characteristics in a region of 4800 MHz or more.

In addition, attenuation characteristics in a desired region may be secured according to the inductance value, and when a shunt capacitor is additionally formed, a notch pole may be formed.

In addition, referring to FIG. 11, when the first inductor 141 is inserted in the antenna pad connected to the first filter circuit 120 in the SAW filter 100 and a corresponding inductance value is 1 nH, attenuation (dB) with respect to frequency may be confirmed as follows. Here, the black graph is for the conventional SAW filter, and the red graph is for the SAW filter 100 of the present invention including the first inductor 141 having an inductance value of 1 nH.

As described above, as the first inductor 141 is inserted in the antenna pad connected to the first filter circuit 120 among the separated antenna pads, it can be confirmed that the SAW filter has excellent attenuation characteristics in a region of 3200 MHz or more.

Figure 12:
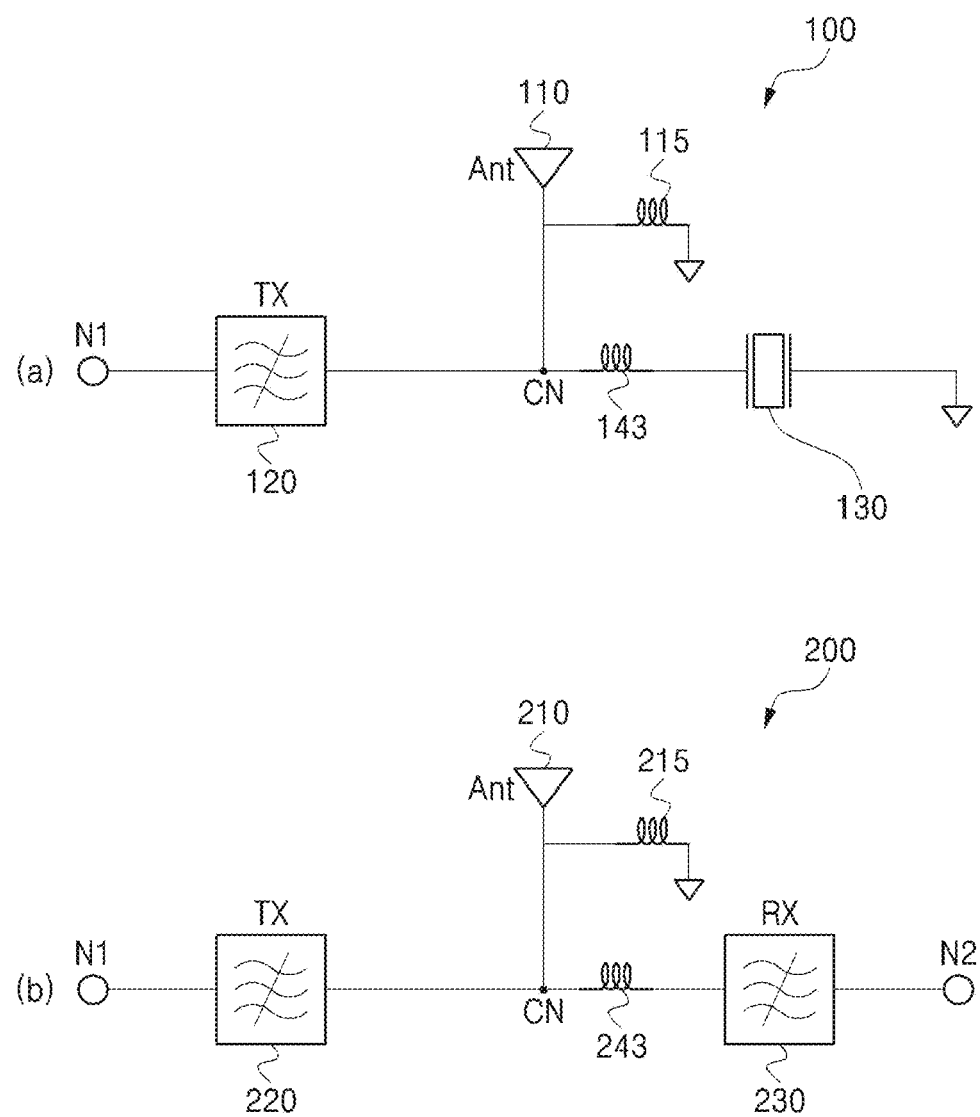
FIG. 12 is a view schematically showing the circuits of a SAW filter and a duplexer according to a third embodiment of the present invention.
Figure 13:
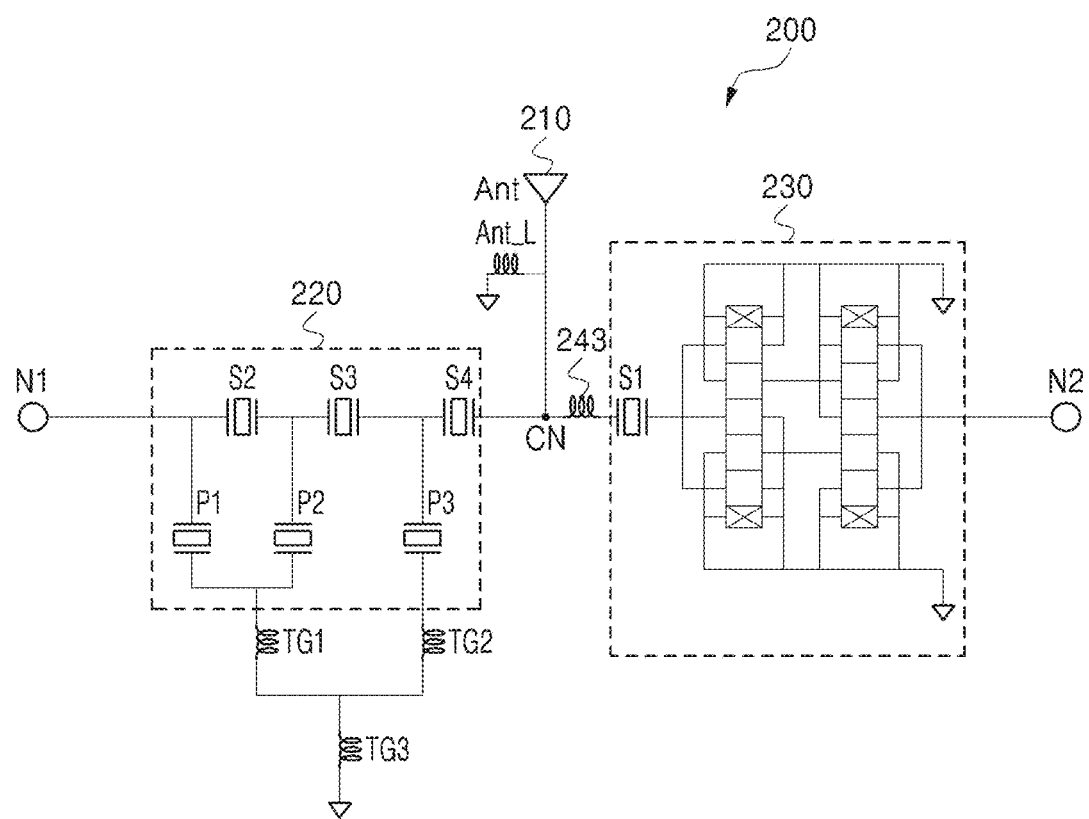
FIG. 13 is a detailed view showing the circuit of a duplexer according to a third embodiment of the present invention.

FIG. 12 is a view schematically showing the circuits of a SAW filter 100 and a duplexer 200 according to a third embodiment of the present invention, and FIG. 13 is a detailed view showing the circuit of a duplexer 200 according to a third embodiment of the present invention.

The SAW filter 100 shown in (a) of FIG. 12 may include an antenna 110, a first filter circuit 120, a second filter circuit 130, and a second inductor 143, and the duplex 200 shown in (b) of FIG. 12 may include an antenna 210, a transmission filter 220, a reception filter 230, and a second inductor 243.

In addition, referring to FIG. 13, the transmission filter 220 of the duplexer 200 may be a ladder-type circuit including a plurality of series SAW resonators S2, S3 and S4 and parallel SAW resonators P1, P2 and P3, and the reception filter 230 may be formed of a series SAW resonator S1 and a plurality of IDT electrodes connected to the SAW resonator S1 in series.

The second inductors 143 and 243 inserted in the SAW filter 100 and the duplexer 200 are connected to the antenna pads connected to the second filter circuit 130 and the reception filter 230 among the two antenna pads branched from the common terminal CN to secure attenuation characteristics in a specific frequency band.

Here, the second inductors 143 and 243 may have an inductance value of up to 8 nH, and the inductance value may vary according to the size of the SAW filter 100 and the duplexer 200.

Figure 14:
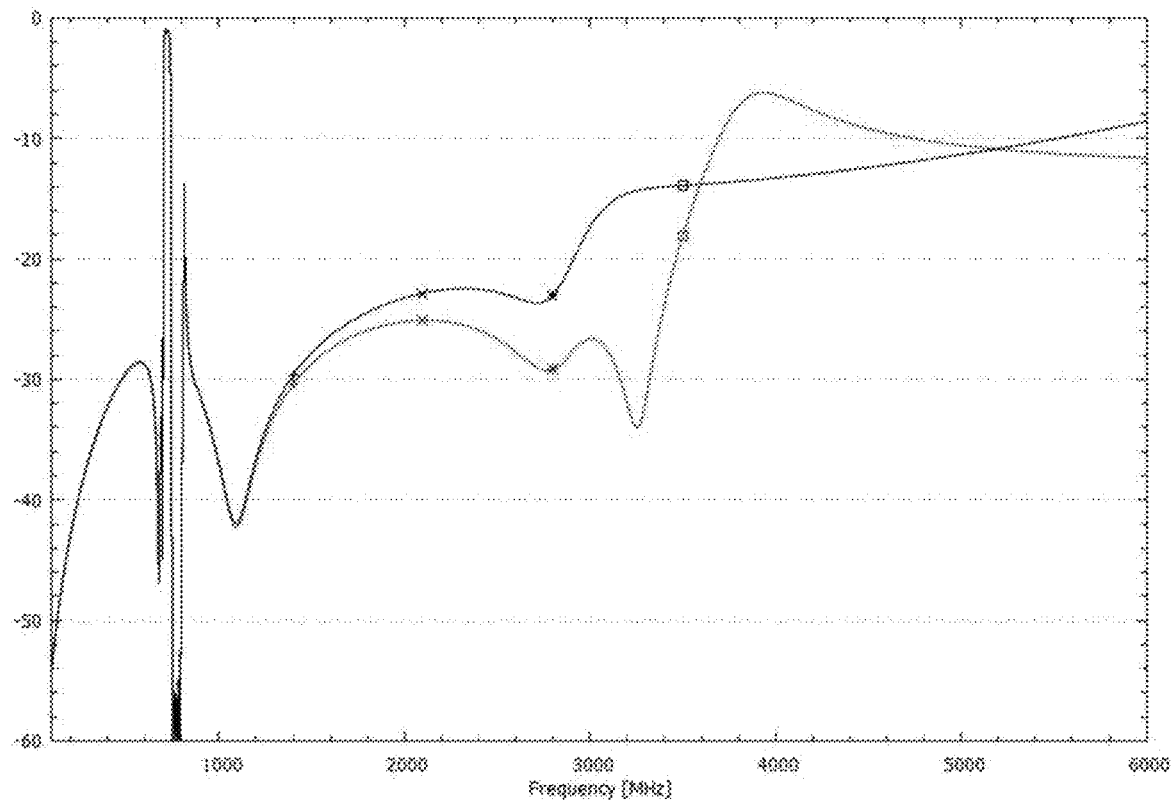
FIG. 14 is a graph illustrating attenuation characteristics in a duplexer according to a third embodiment of the present invention.

FIG. 14 is a graph illustrating attenuation characteristics in a duplexer 200 according to a third embodiment of the present invention.

Referring to FIG. 14, when the second inductor 243 is inserted in the antenna pad connected to the reception filter 230 in the duplexer 200 and a corresponding inductance value is 1 nH, attenuation (dB) with respect to frequency may be confirmed as shown in the figure. Here, the black graph is for the conventional duplexer, and the red graph is for the duplexer 200 of the present invention including the second inductor 243 having an inductance value of 1 nH.

As described above, as the second inductor 243 is inserted in the antenna pad connected to the reception filter 230 among the separated antenna pads, it can be confirmed that a notch is formed while the SAW filter has a sharp skirt characteristic in the high frequency band of 3000 MHz and that the SAW filter has excellent attenuation characteristics in a region of 5000 MHz or more.

Until now, the SAW filter 100 and the duplexer 200 according to the second and third embodiments of the present invention have been described. According to the present invention, attenuation characteristics in a desired frequency band can be acquired by selectively inserting an inductor having various inductance values in a separated antenna pad. In addition, since it does not give a large deformation in the structure of the existing SAW filter 100 and duplexer 200, an external matching space can be secured, and the manufacturing cost can be reduced as an additional material cost for improving the characteristics is not required.

On the other hand, although it is described in the SAW filters 100 of the first to third embodiments that the first or second inductor 141 or 143 is connected in a package including the SAW filter 100, the first or second inductor 141 or 143 may be provided outside the package.

Figure 15:
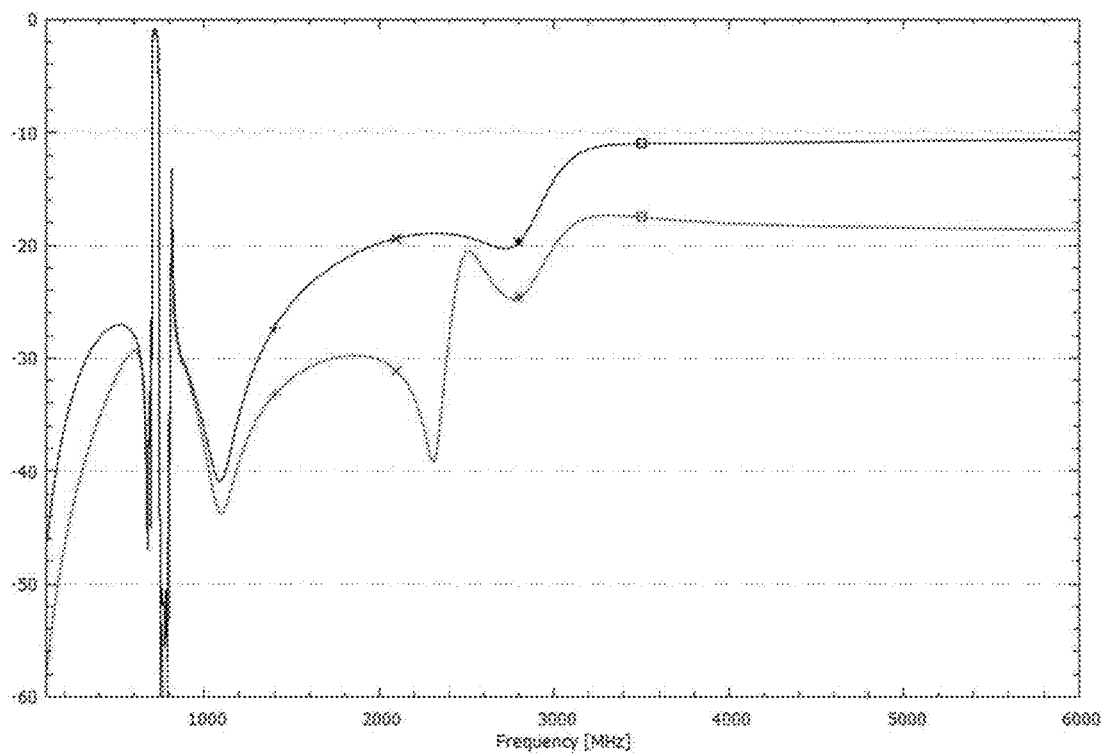
FIGS. 15 to 17 are graphs illustrating attenuation characteristics in SAW filters according to fourth to sixth embodiments of the present invention.
Figure 16:
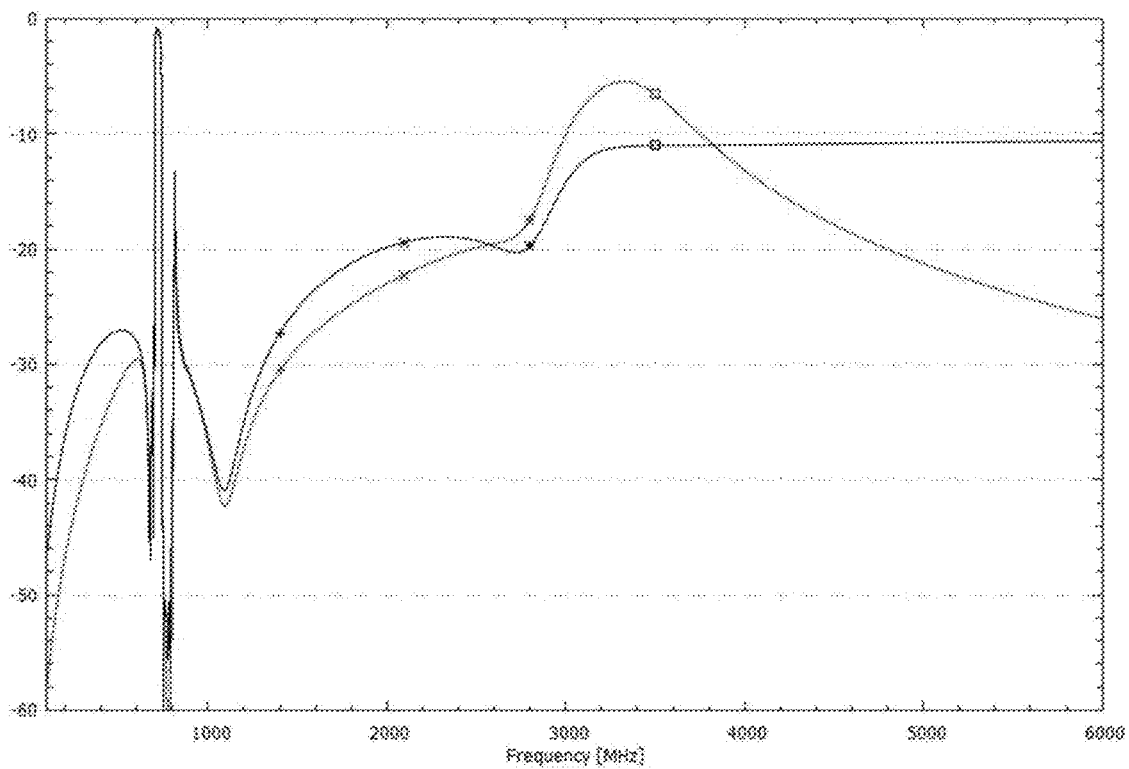
Figure 17:
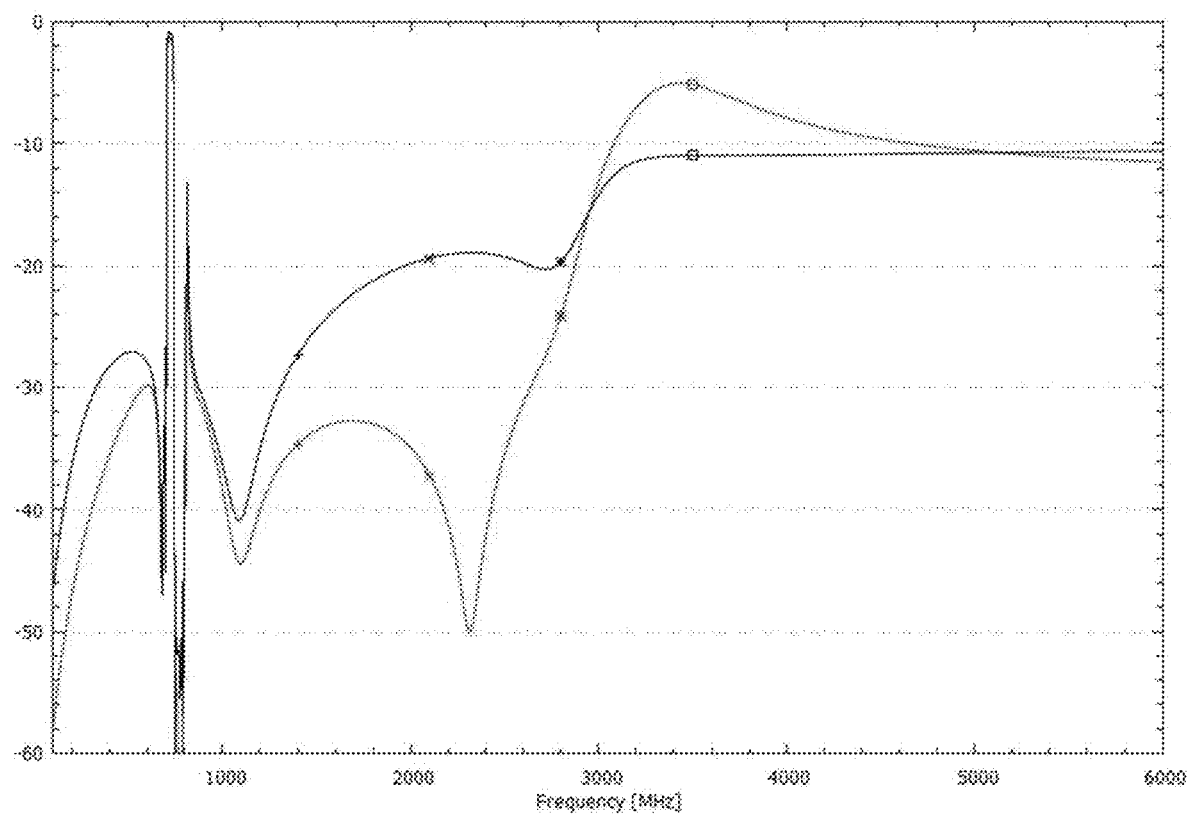

FIGS. 15 to 17 are graphs illustrating attenuation characteristics in the SAW filters 100 according to fourth to sixth embodiments of the present invention.

Referring to FIG. 15, when the first inductor 141 and the second inductor 143 are inserted in the antenna pad connected to the first filter circuit 120 of the SAW filter 100 and the antenna pad connected to the second filter circuit 130 and their inductance values are 1 nH respectively, attenuation (dB) with respect to frequency may be confirmed as shown in the figure.

Here, the graph shown in black color is for the conventional filter in which separation of antenna pads, insertion of inductors and insertion of resonators are not accomplished, and the graph shown in red color is for the SAW filter 100 of the present invention in which the first and second inductors 141 and 143 having an inductance value of 1 nH are inserted after the antenna pads are separated and the SAW resonators are inserted.

That is, it can be confirmed that as the inductors are inserted in the separated antenna pads as described above, a notch is formed while the SAW filter has a sharp skirt characteristic in the high frequency band of 2500 MHz and that the SAW filter has excellent attenuation characteristics in a wide region of 2500 MHz or more.

Referring to FIG. 16, when the first inductor 141 having an inductance value of 1 nH is inserted in the antenna pad connected to the first filter circuit 120 of the SAW filter 100, attenuation (dB) with respect to frequency may be confirmed as shown in the figure. Here, the graph shown in black color is for the conventional filter in which separation of antenna pads, insertion of inductors and insertion of resonators are not accomplished, and the graph shown in red color is for the SAW filter 100 of the present invention in which the first inductor 141 having an inductance value of 1 nH is inserted after the antenna pads are separated and the SAW resonators are inserted.

That is, it can be confirmed that as inductors are inserted in separated antenna pads as described above, the SAW filter has excellent attenuation characteristics in a wide region of 4000 MHz or more.

Referring to FIG. 17, when the second inductor 143 having an inductance value of 1 nH is inserted in the antenna pad connected to the second filter circuit 130 of the SAW filter 100, attenuation (dB) with respect to frequency may be confirmed as shown in the figure. Here, the graph shown in black color is for the conventional filter in which separation of antenna pads, insertion of inductors and insertion of resonators are not accomplished, and the graph shown in red color is for the SAW filter 100 of the present invention in which the second inductor 143 having an inductance value of 1 nH is inserted after the antenna pads are separated and the SAW resonators are inserted.

That is, it can be confirmed that as the inductors are inserted in the separated antenna pads as described above, a notch is formed while the SAW filter has a sharp skirt characteristic in the high frequency band of 2400 MHz and that the SAW filter has excellent attenuation characteristics in a wide region of 5000 MHz or more.

According to the present invention, the attenuation characteristics can be improved in a wider band by separating electrically connected parts (antennas) in two filters that pass frequencies of different bands.

In addition, the attenuation characteristics can be improved in a desired frequency band by adjusting the inductance value of the inductor inserted in the high frequency filter.

In addition, an external matching space can be secured by improving the characteristics in a method of separating the internal antenna of a high-frequency filter and inserting an inductor, and since it has a simple structure, the degree of freedom can be increased in designing SAW filters and duplexers.

In addition, as an inductor is implemented only in a structure of electrically connecting different antenna pads and a package, manufacturing costs for improving the characteristics of the SAW filter and the duplexer can be reduced. In addition, as the electrical structure of connecting separated antennas is included as part of the inductor, it may contribute to improvement of the characteristics.

The effects of the present invention are not limited to the effects mentioned above, and other effects not mentioned will be clearly understood by those skilled in the art from the above description.

Although the embodiments of the present specification have been described with reference to the accompanying drawings, those skilled in the art may understand that the present invention can be implemented in other specific forms without changing the technical spirit or essential features thereof. Therefore, it should be understood that the above-described embodiments are illustrative and not restrictive in all respects.

What is claimed is:

1. A SAW filter including a common terminal, a transmission terminal and a reception terminal through which high-frequency signals are inputted and outputted, the SAW filter comprising:
    a first filter circuit having a first frequency band as a pass band, and connected to the common terminal and the transmission terminal;
    a second filter circuit having a second frequency band different from the first frequency band as a pass band, and connected to the common terminal and the reception terminal;
    an antenna connected to the common terminal; and
    at least one inductor connected in series between the common terminal and the first filter circuit or the second filter circuit,
    wherein the antenna includes a first antenna pad and a second antenna pad which are separated from each other,
        the first antenna pad being branched from the common terminal and connected to the first filter circuit,
        the second antenna pad being branched from the common terminal and connected to the second filter circuit, and
        the first and second antenna pads being provided on the same plane, and
    wherein the at least one inductor is inserted in the first antenna pad or the second antenna pad.

2. The SAW filter according to claim 1, wherein the at least one inductor includes a first inductor inserted in the first antenna pad and a second inductor inserted in the second antenna pad.

3. The SAW filter according to claim 1, wherein an attenuation region of the first filter circuit or the second filter circuit is adjusted according to an inductance value of the at least one inductor.

4. The SAW filter according to claim 1, further comprising at least one shunt capacitor inserted between the first filter circuit or the second filter circuit and the at least one inductor.

5. The SAW filter according to claim 1, further comprising a bump electrically connecting the at least one inductor and the first antenna pad or the second antenna pad.

6. A duplexer including a common terminal, a transmission terminal and a reception terminal through which high-frequency signals are inputted and outputted, the duplexer comprising:
- a transmission filter connected to the common terminal and the transmission terminal;
- a reception filter connected to the common terminal and the reception terminal;
- an antenna connected to the common terminal; and
- at least one inductor connected in series between the common terminal and the transmission filter or the reception filter,
- wherein the antenna includes a first antenna pad and a second antenna pad which are separated from each other,
  - the first antenna pad being branched from the common terminal and connected to the transmission filter,
  - the second antenna pad being branched from the common terminal and connected to the reception filter, and
  - the first and second antenna pads being provided on the same plane, and
- wherein the at least one inductor is inserted in the first antenna pad or the second antenna pad.

7. The duplexer according to claim 6, wherein the at least one inductor includes a first inductor inserted in the first antenna pad and a second inductor inserted in the second antenna pad.

8. The duplexer according to claim 6, wherein an attenuation region of the transmission filter or the reception filter is adjusted according to an inductance value of the at least one inductor.

9. The duplexer according to claim 6, further comprising at least one shunt capacitor inserted between the transmission filter or the reception filter and the at least one inductor.

10. The duplexer according to claim 6, further comprising a bump electrically connecting the at least one inductor and the first antenna pad or the second antenna pad.

11. The duplexer according to claim 6, wherein the reception filter is configured of a ladder-type circuit including a SAW resonator.

12. The duplexer according to claim 6, wherein the reception filter includes:
- a SAW resonator connected on the second antenna pad side in series; and
- a plurality of IDT electrodes connected in series to the SAW resonator.

* * * * *